(12) United States Patent
Carlson et al.

(10) Patent No.: US 9,358,618 B2
(45) Date of Patent: Jun. 7, 2016

(54) IMPLEMENTING REDUCED DRILL SMEAR

(71) Applicant: GLOBALFOUNDRIES INC., Grand Cayman (KY)

(72) Inventors: Brian L. Carlson, Rochester, MN (US); John R. Dangler, Rochester, MN (US); Joseph Kuczynski, Rochester, MN (US); Jeffrey A. Taylor, Rochester, MN (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 274 days.

(21) Appl. No.: 13/953,045

(22) Filed: Jul. 29, 2013

(65) Prior Publication Data

US 2015/0030402 A1   Jan. 29, 2015

(51) Int. Cl.
| | |
|---|---|
| *B23B 35/00* | (2006.01) |
| *B23Q 11/10* | (2006.01) |
| *B23Q 11/12* | (2006.01) |
| *H05K 1/03* | (2006.01) |
| *H05K 3/00* | (2006.01) |
| *H05K 3/46* | (2006.01) |

(52) U.S. Cl.
CPC .............. *B23B 35/00* (2013.01); *H05K 3/0047* (2013.01); *B23B 2226/61* (2013.01); *B23B 2228/36* (2013.01); *B23B 2250/12* (2013.01); *B23Q 11/10* (2013.01); *B23Q 11/12* (2013.01); *H05K 1/034* (2013.01); *H05K 3/0008* (2013.01); *H05K 3/0088* (2013.01); *H05K 3/4676* (2013.01); *H05K 2201/015* (2013.01); *H05K 2203/0207* (2013.01); *H05K 2203/127* (2013.01); *H05K 2203/166* (2013.01); *Y10T 408/03* (2015.01); *Y10T 408/44* (2015.01)

(58) Field of Classification Search
CPC .......... B23Q 11/1038; B23Q 11/1053; B23Q 11/1061; Y10T 408/03; H05K 3/0044; H05K 3/0047; H05K 3/0088
USPC .................................. 408/1 R; 508/181, 582
See application file for complete search history.

(56) References Cited

U.S. PATENT DOCUMENTS

| 4,519,732 A | * | 5/1985 | Sutcliffe ....................... 408/1 R |
| 4,913,931 A | * | 4/1990 | Frederickson ............... 427/97.2 |
| 4,929,370 A | | 5/1990 | Hatch et al. |
| 5,067,859 A | * | 11/1991 | Korbonski .................... 408/1 R |

(Continued)

FOREIGN PATENT DOCUMENTS

| JP | 58092549 A | 6/1983 |
| JP | 09300172 A | 11/1997 |
| JP | 2005159116 A | 6/2005 |

OTHER PUBLICATIONS

Machine Translation of JP09-300172, pp. 4-8, Jun. 25, 2015.*

(Continued)

*Primary Examiner* — Daniel Howell
*Assistant Examiner* — Nicole N Ramos
(74) *Attorney, Agent, or Firm* — Thompson Hine LLP

(57) ABSTRACT

A method is provided for implementing reduction of drill smear in drilling a multilayer substrate such as a rigid printed circuit board or flex to minimize or eliminate the need to remove drill smear and for improved via and interconnect reliability. An inert liquid is applied to the multilayer substrate and a drill bit prior to and during the drill process to cool and lubricate the multilayer substrate and the drill bit to reduce drill smear.

16 Claims, 2 Drawing Sheets

(56) References Cited

U.S. PATENT DOCUMENTS

| | | | |
|---|---|---|---|
| 5,082,402 A | 1/1992 | Gaku et al. | |
| 5,250,105 A * | 10/1993 | Gomes et al. | 106/1.11 |
| 5,332,341 A * | 7/1994 | Arai et al. | 408/61 |
| 5,592,863 A * | 1/1997 | Jaskowiak et al. | 82/1.11 |
| 5,785,465 A * | 7/1998 | Korbonski | 408/1 R |
| 6,294,508 B1 | 9/2001 | Milbrath et al. | |
| 6,356,002 B1 * | 3/2002 | Witherspoon et al. | 310/232 |
| 6,613,413 B1 * | 9/2003 | Japp et al. | 428/131 |
| 6,753,300 B2 | 6/2004 | Eziri et al. | |
| 7,067,759 B2 | 6/2006 | Gabzdyl | |
| 7,587,815 B2 * | 9/2009 | Yoshikawa et al. | 29/830 |
| 7,914,898 B2 | 3/2011 | Yoshikawa et al. | |
| 8,323,798 B2 | 12/2012 | Redfern et al. | |
| 8,383,555 B2 | 2/2013 | Pasquier et al. | |
| 2003/0013617 A1 * | 1/2003 | Howell et al. | 508/180 |
| 2003/0215620 A1 * | 11/2003 | Yoshida et al. | 428/209 |
| 2007/0141310 A1 * | 6/2007 | Song et al. | 428/209 |
| 2009/0214308 A1 * | 8/2009 | Redfern et al. | 408/1 R |
| 2011/0052338 A1 * | 3/2011 | Jenkins | 408/57 |
| 2012/0157363 A1 * | 6/2012 | Knapp et al. | 508/582 |

OTHER PUBLICATIONS

Krytox Wikipedia document, pp. 1-2, Dec. 10, 2015.*
PFPE A Unique Lubricant for a Unique Application, pp. 1-11, Dec. 10, 2015.*

* cited by examiner

IMPLEMENTING REDUCED DRILL SMEAR

FIELD OF THE INVENTION

The present invention relates generally to the data processing field, and more particularly, relates to a method for implementing reduction of drill smear in drilling a multilayer substrate such as a rigid printed circuit board or flex to minimize or eliminate the need to remove drill smear and for improved via and interconnect reliability.

DESCRIPTION OF THE RELATED ART

Manufacturing of high speed boards and flex with Teflon® based or similar dielectrics provides improvements in signal integrity performance versus other standard materials but Teflon® or similar materials have manufacturing and reliability challenges including smear during drilling which negatively impacts via and interconnect reliability.

The chemical inertness of Teflon® makes it difficult to remove drill smear or desmear vias during multilayer manufacturing processes. A reduction in the amount of Teflon® smeared in vias is required to improve via and interconnect reliability.

A need exists for an efficient and effective method for implementing reduction of drill smear in drilling a multilayer substrate.

SUMMARY OF THE INVENTION

Principal aspects of the present invention are to provide methods for implementing reduction of drill smear in drilling a multilayer substrate such as a rigid printed circuit board or flex to minimize or eliminate the need to remove drill smear and for improved via and interconnect reliability. Other important aspects of the present invention are to provide such methods substantially without negative effects and that overcome many of the disadvantages of prior art arrangements.

In brief, a method is provided for implementing reduction of drill smear in drilling a multilayer substrate such as a rigid printed circuit board or flex to minimize or eliminate the need to remove drill smear and for improved via and interconnect reliability. An inert liquid is applied to the multilayer substrate and a drill bit prior to and during the drill process to cool and lubricate the multilayer substrate and the drill bit to reduce drill smear.

In accordance with features of the invention, the inert liquid includes a lubricant having a temperature operating range enabling optimizing substrate temperature for one or more of a specific cross section, a drill stack-up, a hole size and a drill pattern.

In accordance with features of the invention, the inert liquid includes a lubricant compatible with one or more of a specific metal, specific elastomers and plastics including Teflon®.

In accordance with features of the invention, the multilayer substrate includes dielectric materials for enhanced signal integrity performance including for example Teflon® based dielectric materials In accordance with features of the invention, the reduction of drill smear minimizes or eliminates the need to remove drill smear and for improved via and interconnect reliability.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method is provided for implementing reduction of drill smear in drilling a multilayer substrate such as a rigid printed circuit board or flex to minimize or eliminate the need to remove drill smear and for improved via and interconnect reliability.

Figure 1:
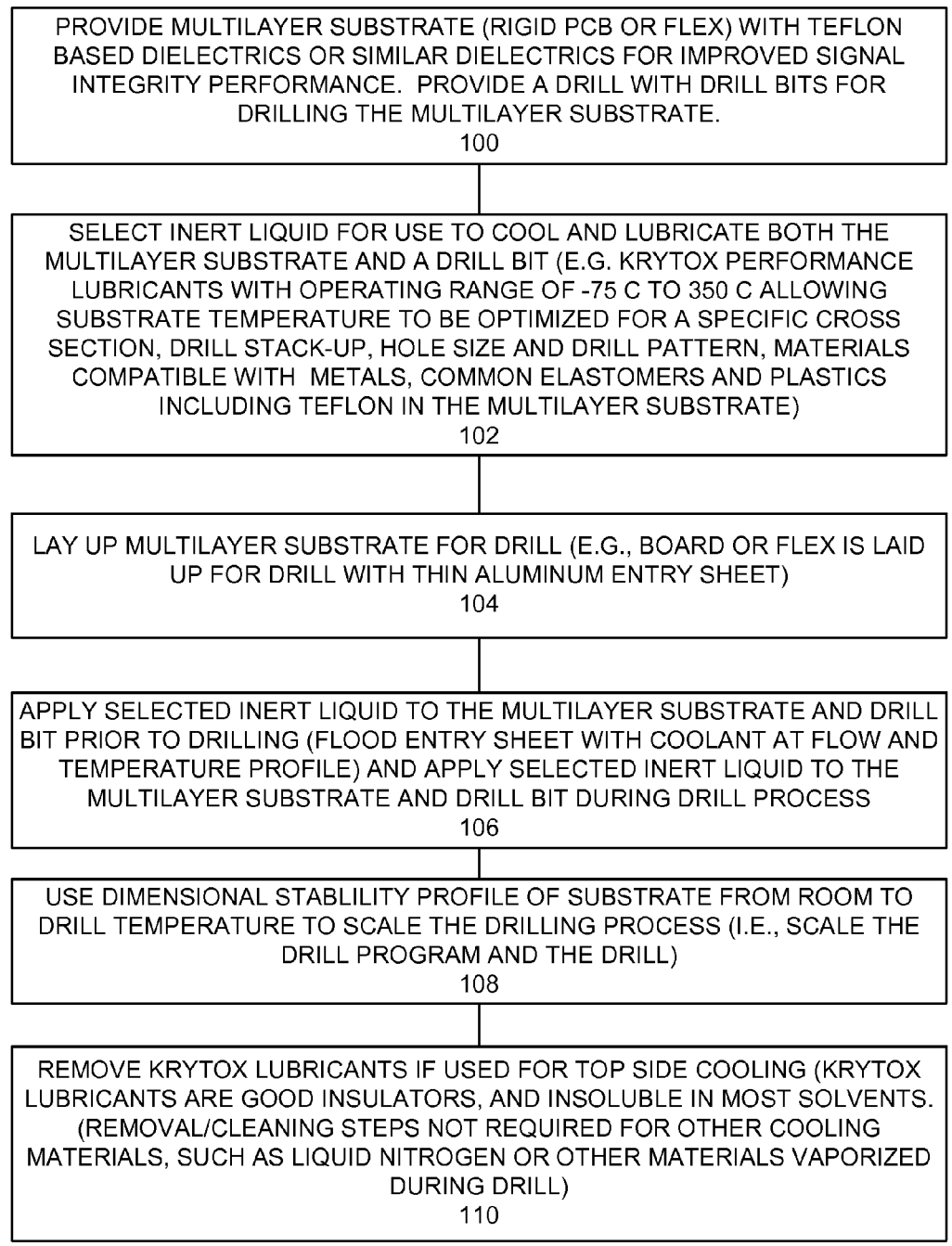
FIG. 1 is a flow chart illustrating exemplary steps for implementing reduction of drill smear in drilling a multilayer substrate such as a rigid printed circuit board or flex to minimize or eliminate the need to remove drill smear and for improved via and interconnect reliability in accordance with the preferred embodiment.

Having reference now to the drawings, in FIG. 1, there is shown a flow chart illustrating example steps for implementing reduction of drill smear in drilling a multilayer substrate in accordance with the preferred embodiment. A multilayer substrate is provided such as a rigid printed circuit board or flex with Teflon® based dielectrics or similar dielectrics for providing improvements in signal integrity performance as indicated in a block 100.

As indicated at a block 102, an inert liquid is selected for use to cool and lubricate the multilayer substrate and a drill bit to be used for drilling vias and through-holes in the multilayer substrate. For example, one set of materials of an inert liquid that can be used include Krytox® performance lubricants.

In accordance with features of the invention, the use of the Krytox® performance lubricants have an operating ranges from −75° C. to 350° C. which will allow the substrate temperature to be optimized for a specific cross section, drill stack-up, hole size and drill pattern. These materials are inert and compatible with most metals, common elastomers and plastics including Teflon®.

Krytox® is a trademarked name of DuPont of a family of high-performance synthetic lubricants, oils and greases, with a variety of applications. Krytox® oils are fluorocarbon polymers of polyhexafluoropropylene oxide, with a chemical formula:

$$F-(CF(CF_3)-CF_2-O)_4-CF_2CF_3$$

where the degree of polymerization, n, generally lies within the range of 10 to 60.

These compounds are collectively known by many names including perfluoropolyether (PFPE), perfluoroalkylether (PFAE) and perfluoropolyalkylether (PFPAE). A unique identifier is their CAS registry number, 60164-51-4.

In addition to PFPE, Krytox® grease also contains telomers of PTFE and was designed as a liquid or grease form of PTFE. It is thermally stable, nonflammable and insoluble in water, acids, bases, and most organic solvents. It is nonvolatile and useful over a broad temperature range of −75 to 350° C. or higher. Krytox® grease has high resistance to ionizing radiation and it can also withstand extreme pressure and high mechanical stress.

As indicated in a block 104, multilayer substrates including boards and flex are often laid up for drill with a thin aluminum entry sheet, the board or flex and a backer material. While thin boards and flex may be stacked up multiple up, single up drill is not unusual especially with high performance materials. This lay up supports cooling through the substrate from coolant on one side. Top or bottom or both side cooling is feasible. Top side is now described in more detail and provides drill cooling in addition to substrate cooling.

As indicated in a block 106, after layup in a modified drill, an open loop coolant system floods the entry sheet with coolant at a flow and temperature profile so the substrate and drill tool reach their desired temperature profiles.

As indicated in a block 108, a dimensional stability profile of the substrate from room to drill temperature would be used to scale the drill process, I.E., to scale the drill program and the drill.

As indicated in a block 110, an optional step to remove Krytox® lubricants is used if the lubricant was used for top side cooling. Krytox® lubricants are insoluble in most solvents but are soluble in highly fluorinated fluids and some supercritical fluids such as $CO_2$. Alternate materials can be used to cool the substrate. Liquid nitrogen and other materials would provide significant tool and substrate cooling. During drill, heat would vaporize coolant at the drill interface providing a scrubbing action in the hole. Water would facilitate cooling to near 0 C. These materials would not require subsequent cleaning steps.

Figure 2:
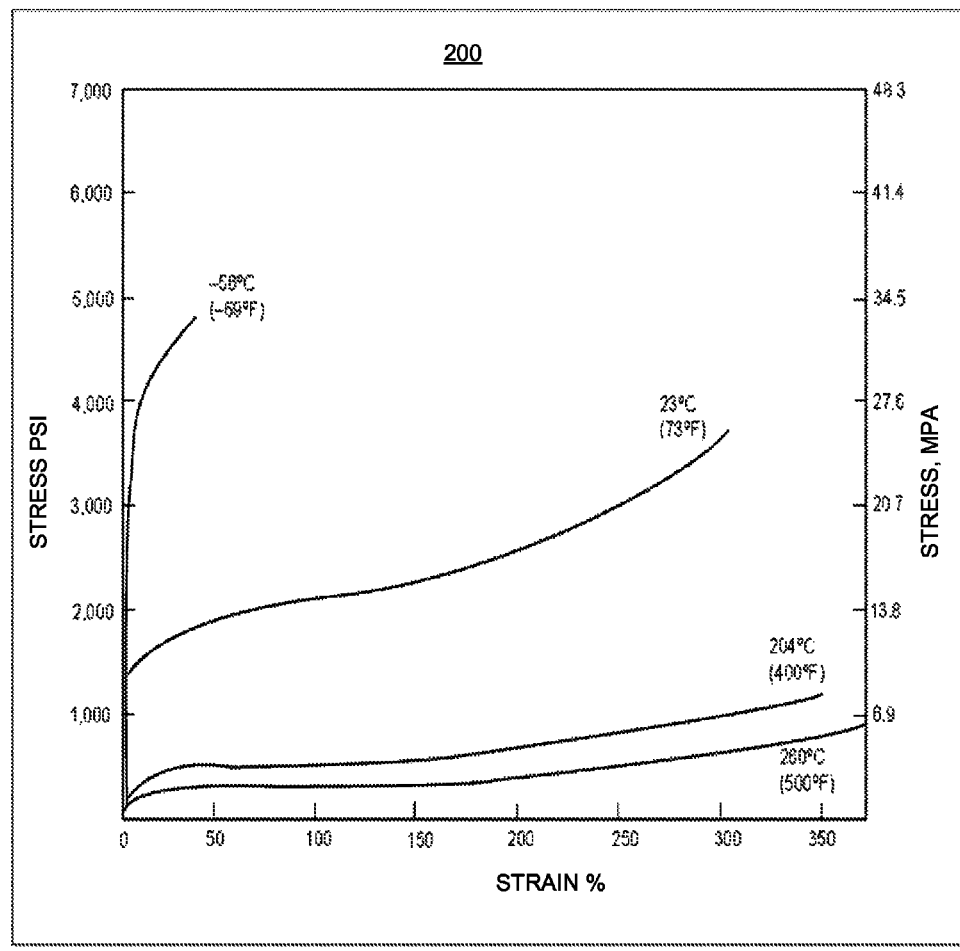
FIG. 2 is a chart illustrating stress versus strain in tension for Teflon® PTFE in accordance with a preferred embodiment.

Referring also to the data of FIG. 2, there is shown a chart illustrating stress versus strain in tension for Teflon® PTFE provided by DuPont generally designated by the reference character 200 in accordance with the preferred embodiment. As seen in the illustrated stress/strain curve 200, a reduction in drill temperature has a significant reduction in the amount of Teflon® drill smear (i.e., as the temperature is reduced, the strain to break is also reduced and this results is less smear). Moreover, drilling at low temperature should improve drill bit life (pre-drill cooling treatment of drill bits has been shown to increase bit life) as well as enable a wider drill speed process window.

It should be understood that the present invention is not limited to use of the example Krytox® lubricants, other inert liquids may be chosen by those skilled in the art.

While the present invention has been described with reference to the details of the embodiments of the invention shown in the drawing, these details are not intended to limit the scope of the invention as claimed in the appended claims.

What is claimed is:

1. A method for reducing drill smear, the method comprising:
   providing a multilayer substrate including dielectric materials configured to provide signal integrity performance; and
   applying an inert liquid to the multilayer substrate and a drill bit prior to and while drilling the multilayer substrate to cool and lubricate the multilayer substrate and the drill bit,
   wherein cooling the multilayer substrate and the drill bit reduces drill smear within the multilayer substrate, and the inert liquid is a fluorocarbon polymer of polyhexafluoropropylene oxide having a chemical formula of:
   $F-(CF(CF_3)-CF_2-O)n-CF_2CF_3$, with n in a range of 10 to 60.

2. The method of claim 1 wherein the multilayer substrate is one of a rigid printed circuit board and a flex circuit board.

3. The method of claim 1 wherein applying an inert liquid to the multilayer substrate and a drill bit eliminates the need to remove drill smear.

4. The method of claim 1 wherein applying the inert liquid to the multilayer substrate and a drill bit results in improved via and interconnect reliability of the multilayer substrate.

5. The method of claim 1 wherein the inert liquid includes a temperature operating ranges from −75° C. to 350° C.

6. The method of claim 1 wherein the inert liquid is compatible with one or more of: a specific metal, an elastomer and polytetrafluoroethylene (PTFE).

7. The method of claim 1 comprising removing the inert liquid after drilling the multilayer substrate.

8. A method for reducing drill smear in a printed circuit board, the method comprising:
   providing a multilayer substrate including polytetrafluoroethylene (PFTE)-based dielectric materials; and
   applying an inert liquid to the multilayer substrate and a drill bit prior to and during drilling the multilayer substrate to cool and lubricate the multilayer substrate and the drill bit, wherein cooling the multilayer substrate and the drill bit reduces the drill smear within the multilayer substrate,
   wherein the inert liquid is a fluorocarbon polymer of polyhexafluoropropylene oxide having a chemical formula of: $F-(CF(CF_3)-CF_2-O)n-CF_2CF_3$, with n in a range of 10 to 60.

9. The method of claim 7 wherein applying the inert liquid to the multilayer substrate and the drill bit results in improved via and interconnect reliability of the multilayer substrate.

10. The method of claim 8 comprising removing the inert liquid after the drill process.

11. The method of claim 7 wherein the inert liquid is compatible with one or more of a specific metal, an elastomer and polytetrafluoroethylene PTFE.

12. The method of claim 1 wherein the inert liquid provides top side cooling to the multilayer substrate.

13. The method of claim 7 wherein the inert liquid provides top side cooling to the multilayer substrate.

14. The method of claim 1 including providing polytetrafluoroethylene (PTFE) based dielectric materials for the multilayer substrate.

15. The method of claim 1 wherein the multilayer substrate is a lubricant having a temperature operating range that optimizes a substrate temperature for one or more of: a specific cross section, a drill stack-up, a hole size, drill equipment, drill feed rate, drill speed rate and drill pattern.

16. The method of claim 8 wherein the multilayer substrate is a lubricant having a temperature operating range that optimizes a substrate temperature for one or more of: a specific cross section, a drill stack-up, a hole size, drill equipment, drill feed rate, drill speed rate and drill pattern.

* * * * *